United States Patent
Goto et al.

(10) Patent No.: US 10,233,125 B2
(45) Date of Patent: Mar. 19, 2019

(54) ALUMINIUM-SILICON CARBIDE COMPOSITE, AND POWER-MODULE BASE PLATE

(71) Applicant: DENKA COMPANY LIMITED, Tokyo (JP)

(72) Inventors: Daisuke Goto, Omuta (JP); Hideki Hirotsuru, Omuta (JP); Yoshitaka Taniguchi, Omuta (JP); Goh Iwamoto, Omuta (JP); Kazunori Koyanagi, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 15/127,214

(22) PCT Filed: Mar. 18, 2015

(86) PCT No.: PCT/JP2015/058068
§ 371 (c)(1),
(2) Date: Sep. 19, 2016

(87) PCT Pub. No.: WO2015/141729
PCT Pub. Date: Sep. 24, 2015

(65) Prior Publication Data
US 2017/0107158 A1    Apr. 20, 2017

(30) Foreign Application Priority Data
Mar. 18, 2014    (JP) ................ 2014-054706

(51) Int. Cl.
*C04B 35/80* (2006.01)
*C04B 41/88* (2006.01)
(Continued)

(52) U.S. Cl.
CPC .......... *C04B 35/806* (2013.01); *C04B 41/009* (2013.01); *C04B 41/5155* (2013.01);
(Continued)

(58) Field of Classification Search
USPC ....................................... 428/220
See application file for complete search history.

(56) References Cited

U.S. PATENT DOCUMENTS

| 4,871,008 A | 10/1989 | Dwivedi et al. |
|---|---|---|
| 4,998,578 A | 3/1991 | Dwivedi et al. |
| (Continued) | | |

FOREIGN PATENT DOCUMENTS

| CN | 106463484 A | 2/2017 |
|---|---|---|
| JP | H02-197368 A | 8/1990 |
| (Continued) | | |

OTHER PUBLICATIONS

Machine_English_Translation_JP_2003204022_A; Heat Radiating Component; Jul. 18, 2003; JPO; whole document.*

(Continued)

*Primary Examiner* — Tahseen Khan
(74) *Attorney, Agent, or Firm* — Oliff PLC

(57) ABSTRACT

To provide an aluminum-silicon carbide composite which is suitable for use as a power-module base plate. An aluminum-silicon carbide composite wherein a peripheral portion having, as a main component thereof, an aluminum-ceramic fiber composite containing ceramic fibers having an average fiber diameter of at most 20 μm and an average aspect ratio of at least 100, is provided on the periphery of a flat plate-shaped aluminum-silicon carbide composite having a plate thickness of 2 to 6 mm formed by impregnating, with a metal containing aluminum, a porous silicon carbide molded body having a silicon carbide content of 50 to 80 vol %, and wherein the proportion of the aluminum-ceramic fiber composite occupied in the peripheral portion is at least 50 area %.

8 Claims, 2 Drawing Sheets

(51) Int. Cl.
  *C04B 41/00* (2006.01)
  *C04B 41/51* (2006.01)
  *H01L 23/373* (2006.01)
  *H01L 21/48* (2006.01)
  *C04B 111/00* (2006.01)

(52) U.S. Cl.
  CPC .......... *C04B 41/88* (2013.01); *H01L 21/4871* (2013.01); *H01L 23/3733* (2013.01); *C04B 2111/00844* (2013.01); *C04B 2235/3826* (2013.01); *C04B 2235/402* (2013.01); *C04B 2235/5264* (2013.01); *H01L 2924/0002* (2013.01)

(56) References Cited

U.S. PATENT DOCUMENTS

| | | | | |
|---|---|---|---|---|
| 5,552,352 | A | * | 9/1996 | Brun ..................... C04B 35/573 428/368 |
| 6,107,225 | A | * | 8/2000 | Shobu ................. C04B 35/5607 264/682 |
| 6,399,187 | B1 | * | 6/2002 | Terasaki .............. C04B 38/0003 257/E23.009 |
| 6,447,894 | B1 | | 9/2002 | Hirotsuru et al. |
| 2009/0092793 | A1 | * | 4/2009 | Hirotsuru .............. C04B 41/009 428/158 |
| 2009/0280351 | A1 | | 11/2009 | Hirotsuru et al. |
| 2011/0316040 | A1 | * | 12/2011 | Hirotsuru ............... B22D 18/02 257/103 |
| 2017/0107158 | A1 | | 4/2017 | Goto et al. |

FOREIGN PATENT DOCUMENTS

| | | |
|---|---|---|
| JP | H05-507030 A | 10/1993 |
| JP | H05-508350 A | 11/1993 |
| JP | H11-269575 A | 10/1999 |
| JP | H11-277217 A | 10/1999 |
| JP | 2003-204022 A | 7/2003 |
| JP | 2003204022 A1 * | 7/2003 |
| JP | 3468358 B2 | 11/2003 |
| JP | 2010-024077 A | 2/2010 |
| WO | 91/17011 A1 | 11/1991 |
| WO | 92/017297 A1 | 10/1992 |
| WO | 2007/080701 A1 | 7/2007 |
| WO | 2007/125878 A1 | 11/2007 |

OTHER PUBLICATIONS

Jun. 16, 2016 International Search Report issued in International Patent Application No. PCT/JP2015/058068.
Oct. 6, 2015 International Search Report issued in Patent Application No. PCT/JP2015/071082.
Nishida, Yoshinori, "Development of Research of Composite Materials Production by Pressure Impregnation," Materia Japan, vol. 36, No. 1, pp. 40-46, (1997).
Oct. 23, 2017 Office Action issued in U.S. Appl. No. 15/328,723.
U.S. Appl. No. 15/127,214, filed Sep. 19, 2016 in the name of Miyakawa et al.
Feb. 14, 2018 Office Action issued in U.S. Appl. No. 15/328,723.
U.S. Appl. No. 15/328,723, filed Jan. 24, 2017 in the name of Miyakawa et al.

* cited by examiner

US 10,233,125 B2

ALUMINIUM-SILICON CARBIDE COMPOSITE, AND POWER-MODULE BASE PLATE

TECHNICAL FIELD

The present invention relates to an aluminum-silicon carbide composite that is suitable for use as a power-module base plate, and a power-module base plate using the same.

BACKGROUND ART

In the present day, with the higher integration and downsizing of semiconductor elements, the amount of heat generated is ever increasing, and the problem of how to efficiently dissipate heat is becoming important. Additionally, circuit boards having a copper or aluminum metal circuit formed on the front surface of a ceramic substrate having high insulation properties and high thermal conductivity such as, for example, an aluminum nitride substrate or a silicon nitride substrate, and a copper or aluminum metal heat dissipating plate on the rear surface, are used as power-module circuit boards.

The typical heat dissipation structure of a conventional circuit board comprises a metal plate, for example, a base plate soldered by way of a copper plate, on the rear surface (heat dissipation surface) of a circuit board, and copper has been generally used for the base plate. However, with this structure, when a thermal load is applied to the semiconductor device, cracks caused by the thermal expansion coefficient difference between the base plate and the circuit board may occur in the solder layer, and as a result, the heat dissipation may be inadequate and cause problems such as malfunctions or damage to the semiconductor element.

Therefore, an aluminum-silicon carbide composite has been proposed as a base plate for making the thermal expansion coefficient closer to that of circuit boards. As the production method for the aluminum-silicon carbide composite for use in a base plate, a molten metal casting method involving pressurized impregnation of a molten aluminum alloy into a silicon carbide porous body (Patent Document 1) and a non-pressurized impregnation method involving non-pressurized penetration of a molten aluminum alloy into a silicon carbide porous body (Patent Document 2) have been brought into practice.

However, aluminum-silicon carbide composites have the problem that, when producing a heat dissipating component or the like as described above, high-precision shape working and screw-hole working is required, and in order to allow working, the compositing of the silicon carbide causes problems such as inferior workability and increased cost.

Therefore, in order to solve the above-mentioned problem, it has become customary to arrange beforehand to have the parts of the aluminum-porous silicon carbide molded body that are to be worked made out of an aluminum alloy, which excels in workability, and to perform shape working and screw-hole working by known metalworking methods.

[Patent Document 1] JP 3468358 B
[Patent Document 2] JP H5-507030 A

SUMMARY OF THE INVENTION

Power modules are often used by joining them to heat dissipating fins via a base plate, and the shape and warpage of the joined part can be mentioned as important properties. When an aluminum-silicon carbide composite is to be used as a power-module base plate, repeated use can cause thermal stress to be generated due to the thermal expansion coefficient difference between the peripheral aluminum alloy portions of the aluminum-silicon carbide composite and the aluminum-silicon carbide composite, resulting in waving or depressions in the aluminum-silicon carbide composite, lowering the adhesion between the base plate and the heat dissipating fin, and in some cases, significantly reducing the thermal conductivity. Furthermore, the shape of the aluminum-silicon carbide composite may be strained, placing a load on the aluminum-silicon carbide composite, and in some cases, causing cracks to form.

Additionally, when impregnating a porous silicon carbide molded body with an aluminum alloy, and cooling, residual thermal stress is created by the thermal expansion coefficient difference between the aluminum-silicon carbide composite and the peripheral aluminum alloy portions. Since aluminum alloys have low strength, the stress of peripheral working or the like causes to free the residual stress and causes cracks to form in the peripheral aluminum alloy portions and the aluminum-silicon carbide composite.

The present invention addresses the problem of reducing the thermal expansion coefficient difference between the aluminum-silicon carbide composite and the peripheral aluminum alloy portions, and providing an aluminum-silicon carbide composite with better reliability.

In other words, the present invention is directed to an aluminum-silicon carbide composite having, on a periphery excluding both main surfaces of a first phase comprising a flat plate-shaped aluminum-silicon carbide composite having a plate thickness of 2 to 6 mm formed by impregnating, with a metal containing aluminum, a porous silicon carbide molded body having a silicon carbide content of 50 to 80 vol %; a second phase comprising an aluminum-ceramic fiber composite containing, at a proportion of 3 to 20% by volume, ceramic fibers having an average fiber diameter of at most 20 μm and an average aspect ratio of at least 100; wherein the proportion of the aluminum-ceramic fiber composite contained in the second phase is at least 50 area % of the peripheral area of the first phase.

In the present invention, it is preferable for the thermal expansion coefficient of the aluminum-ceramic fiber composite to be less than $20 \times 10^{-6}$/K, the strength at 25° C. to be at least 200 MPa and the strength at 150° C. to be at least 150 MPa.

In the present invention, both main surfaces or one main surface of the aluminum-silicon carbide composite may be configured to be covered by an aluminum alloy layer or an aluminum-ceramic fiber layer.

In the present invention, the ceramic fiber content in the aluminum-ceramic fiber composite contained in the second phase should preferably be 3 to 20 vol % with respect to the entire aluminum-ceramic fiber composite. Additionally, the ceramic fiber preferably comprises one or more materials chosen from among alumina, silica, boron nitride, silicon carbide and silicon nitride.

Additionally, the present invention is directed to a power-module base plate formed by plating the front surface of the aluminum-silicon carbide composite.

By forming a second phase comprising an aluminum-ceramic fiber composite as the peripheral portion of a first phase comprising an aluminum-silicon carbide composite, the thermal expansion coefficient difference between the aluminum-silicon carbide composite and the peripheral portion can be reduced, and the stability of the shape can be improved even with repeated use. The present invention has good heat dissipation after soldering to a ceramic circuit board, and is therefore particularly suitable for use as a power-module base plate requiring high reliability.

MODES FOR CARRYING OUT THE INVENTION

The present invention relates to a composite formed by impregnating, with a metal containing aluminum, a molded body formed by providing ceramic fibers adjacent to a peripheral portion of a porous silicon carbide molded body. The composite of the present invention has a structure wherein an aluminum-ceramic fiber composite formed by impregnating ceramic fibers with an aluminum alloy is provided adjacent to a peripheral portion of an aluminum-silicon carbide composite formed by impregnating a porous silicon carbide molded body with an aluminum alloy. Therefore, the aluminum-silicon carbide composite and the aluminum-ceramic fiber composite are continuously connected to each other by the same metal. For this reason, the present invention has the effect of being able to prevent the occurrence of separation or the like at the boundary formed between the porous silicon carbide molded body and the ceramic fiber which are adjacent to each other. Structural examples of the aluminum-silicon carbide composite of the present invention are illustrated in FIGS. 1 and 2, but the present invention is not limited thereto.

The proportion of the aluminum-ceramic fiber composite (second phase) provided on the peripheral portion of the aluminum-silicon carbide composite (first phase) is preferably at least 50 area % of the peripheral portion excluding both main surfaces of the aluminum-silicon carbide composite (first phase). If less than 50 area %, the thermal expansion coefficient difference between the peripheral aluminum alloy portion and the aluminum-silicon carbide composite (first phase) cannot be reduced, so that waving or depressions can be formed upon repeated use, and there is a possibility of cracks being formed in the peripheral aluminum alloy portion and the aluminum-silicon carbide composite (first phase) due to thermal stress caused by the thermal expansion coefficient difference between the aluminum-silicon carbide composite and the peripheral aluminum alloy portion during impregnation and cooling. A "main surface" refers to the front surface or the rear surface, "both main surfaces" refers to both the front and rear surfaces, and "one main surface" or "either main surface" refers to either the front surface or the rear surface.

In the present invention, the porous silicon carbide molded body is a molded body, for example, a sintered body, having pores that can be impregnated by a metal, that is not susceptible to deformation, destruction or the like during an impregnation operation or the like, for example, having a mechanical strength of about 10 MPa. Additionally, in the present invention, ceramic fibers refer to assemblies of fibrous inorganic compounds, which do not particularly need any mechanical strength, and may be in the state of a blanket, a mat, or the like.

As the ceramic fiber, a commercially available type containing alumina, silica, boron nitride, silicon carbide, silicon nitride or the like may be used. Of these, those containing alumina or silica are preferred because they are inexpensive and easy to obtain. Additionally, those containing silicon carbide are preferred for having high thermal conductivity in the fiber direction and being able to dissipate heat easily.

Additionally, in the present invention, the thermal expansion coefficient of the aluminum-ceramic fiber composite (second phase) is preferably less than $20 \times 10^{-6}$/K, the strength at 25° C. is preferably at least 200 MPa and the strength at 150° C. is preferably at least 150 MPa. If the thermal expansion coefficient is $20 \times 10^{-6}$/K or more, the thermal expansion coefficient difference between the aluminum-silicon carbide composite (first phase) and the aluminum-ceramic fiber composite (second phase) becomes large, and cracks can be formed in the first phase and the second phase, which is undesirable. Additionally, if the strength at 25° C. is less than 200 MPa or the strength at 150° C. is less than 150 MPa, stress generated during machining such as peripheral working can cause cracks to form in the aluminum-ceramic fiber composite (second phase), which is undesirable.

The volume proportion of the ceramic fiber used in the present invention should preferably be 3 to 20 vol %. If 20 vol % is exceeded, the ceramic fiber content can be too high, much of the ceramic fiber may be exposed on the aluminum-ceramic fiber composite surface, and in some cases, the plating adhesion can be reduced. On the other hand, if the volume proportion is less than 3 vol %, then the thermal expansion coefficient of the aluminum-ceramic fiber composite can become high, which is undesirable.

Additionally, the average fiber diameter of the ceramic fiber used in the present invention is preferably at most 20 μm and the average aspect ratio is preferably at least 100. If the average aspect ratio is less than 100 or the average fiber diameter exceeds 20 μm, many coarse particles of glass material having low strength will be present in the aluminum-ceramic composite, and this is undesirable because cracks may originate in the coarse glass particles due to stress generated by machining such as peripheral working. The "average fiber diameter" refers to the average of values obtained by observing 20 or more ceramic fibers using a scanning electron microscope and measuring the diameters of the fibers by image analysis. The "average aspect ratio" refers to the value of the "average length" measured in a manner similar to the "average diameter", divided by the "average diameter".

The production methods of the aluminum-silicon carbide composite can be largely divided to two kinds, impregnation methods and powder metallurgy methods. Of these, powder metallurgy method does not provide composites that are satisfactory in terms of their properties such as thermal conductivity, and the only composites that have actually been commercialized are those produced by impregnation. There are also various methods of impregnation, and including methods performed at standard pressure and methods performed at high pressure (high-pressure casting). High-pressure casting includes molten metal casting and die casting.

The preferable method in the present invention is high-pressure casting in which impregnation is performed at a high pressure, and either molten metal casting or die casting may be used, but molten metal casting is more preferable. High-pressure casting is a method wherein a high-pressure container is filled with a porous silicon carbide molded body, and this is impregnated with a molten aluminum alloy at a high temperature and a high pressure to obtain a composite.

Herebelow, examples of production methods using molten metal casting in the present invention will be explained.

A silicon carbide powder (if necessary, a binder such as silica or the like may be added), which is the raw material, is molded and baked to produce a porous silicon carbide molded body. As for the production method of the porous silicon carbide molded body, there are no particular limitations, and a generally known method may be used for production. For example, a porous silicon carbide molded body can be obtained by adding silica, alumina or the like as a binder to a silicon carbide powder, mixing, molding and baking at 800° C. or higher. There are also no particular limitations on the molding method, and press molding, extrusion molding, cast molding or the like may be used, possibly in conjunction with a binder for shape retention as needed.

In the present invention, in order to form a uniform aluminum layer of a predetermined thickness, the molded or baked product should preferably be surface-worked so that the in-plane thickness variation of the porous silicon carbide molded body is 100 μm or less, preferably 30 μm or less. If the in-plane thickness variation of the porous silicon carbide molded body exceeds 100 μm, the thickness variation of the surface aluminum layer of the resulting aluminum-silicon carbide composite will become large, which is undesirable.

At the periphery of the porous silicon carbide molded body, ceramic fibers are arranged adjacent thereto. The ceramic fibers are arranged so that they occupy at least 50 area % of the periphery of the porous silicon carbide molded body. Thereafter, the porous silicon carbide molded body is clamped between mold release plates coated with a mold release agent, and stacked to form a single block. When stacking the porous silicon carbide molded body to form a single block, it is stacked and clamped between mold release plates so that the fastening torque in the planar direction is 1 to 20 Nm. The stacking method is not particularly limited, but for example, may be a method wherein the porous silicon carbide molded body is stacked and clamped between stainless steel mold release plates coated with a mold release agent, iron plates are positioned on both sides, fastened by bolts, and tightened with a predetermined tightening torque to form a single block. While the appropriate tightening torque in the planar direction differs depending on the strength of the porous silicon carbide molded body being used, if the tightening torque is less then 1 Nm, the surface aluminum layer of the resulting aluminum-silicon carbide composite may be too thick, or the thickness difference may be too large. On the other hand, if the tightening torque exceeds 20 Nm, the surface aluminum layer of the resulting aluminum-silicon carbide composite may be locally too thin, and the aluminum-silicon carbide composite may be partially exposed during subsequent surface treatments such as plating pretreatments or the like, and in some cases, there may be problems such as the plating not adhering or the plating adhesion being lower at those portions.

Additionally, when stacking the porous silicon carbide molded body, ceramic fibers containing alumina or silica may be stacked on both main surfaces or one main surface of the porous silicon carbide molded body and clamped between a mold release plate. By placing the ceramic fibers adjacent thereto, the thickness of the aluminum alloy layer of the aluminum-silicon carbide composite can be controlled to be uniform, so this is preferable.

Next, after preheating the block at about 500 to 750° C., one or more such blocks are placed inside a high-pressure container, molten aluminum alloy is supplied as quickly as possible in order to prevent the temperature of the block from dropping, and a pressure of at least 30 MPa is applied. By impregnating the cavities in the porous silicon carbide molded body and the spaces in the ceramic fibers with aluminum alloy, an aluminum-silicon carbide composite having an aluminum-ceramic fiber composite on the periphery and provided with an aluminum layer on both main surfaces or on one main surface is obtained. Additionally, if ceramic fibers containing alumina or silica are stacked on both main surfaces or on one main surface of the porous silicon carbide molded body, an aluminum-ceramic fiber layer is provided on both main surfaces or on one main surface of the aluminum-silicon carbide composite. The impregnated product may also be annealed for the purpose of removing strain generated at the time of impregnation.

Regarding the aluminum alloy used in the present invention, there are no particular limitations, and general-purpose aluminum alloys may be used. In view of the ease of casting and achievement of high thermal conductivity, cast aluminum alloys with a Si content of 4% to 10%, such as AC2A, AC2B, AC4A, AC4B, AC4C, AC8B, AC4D, AC8C, ADC10 and ADC12, or wrought aluminum alloys such as those of the 1000 series, 2000 series, 3000 series, 4000 series, 5000 series, 6000 series or 7000 series are particularly preferable.

The particularly important properties of the aluminum-silicon carbide composite are the thermal conductivity and the thermal expansion coefficient. While it is preferable for the silicon carbide content in the aluminum-silicon carbide composite to be higher because this makes the thermal conductivity higher and the thermal expansion coefficient smaller, if the content is too high, the aluminum alloy impregnation operation can no longer be easily performed. In practice, the relative density of the porous silicon carbide molded body should preferably be in the range of 50 to 80%. Additionally, the strength of the porous silicon carbide molded body should be such that the bending strength is at least 3 MPa, since this eliminates the risk of breakage when handling or during impregnation.

The aluminum layer comprising an aluminum alloy provided on the aluminum-silicon carbide composite surface has an average thickness of 0.05 mm to 0.3 mm, preferably 0.05 mm to 0.1 mm. The thickness of the aluminum layer may be adjusted to a predetermined thickness by grinding the aluminum-silicon carbide composite surface. The aluminum layer is needed in order to ensure plating adhesion when plating. If the average thickness is less than 0.05 mm, the aluminum-silicon carbide composite may be partially exposed during subsequent surface treatments such as plating pretreatments, and in some cases, can cause problems such as the plating not adhering or the plating adhesion being lower at those portions. On the other hand, if the average thickness exceeds 0.3 mm, the thermal expansion rate of the resulting base plate itself can be too high, and in some cases, the reliability of the joined portion can be reduced. Furthermore, if the average thickness exceeds 0.3 mm, in some cases, the difference in thickness in the aluminum layer may become large.

When the aluminum-silicon carbide composite is used as a power-module base plate, the difference in average thickness between the aluminum layers on both main surfaces is 0.05 mm or less. The power-module base plate has a structure comprising aluminum layers on both main surfaces of an aluminum-silicon carbide composite. Since the aluminum-silicon carbide composite and the aluminum layers have different thermal expansion rates, if the difference in average thickness between the aluminum layers on both main surfaces exceeds 0.05 mm, there are problems such as changes in the warpage when applying thermal cycling during the subsequent power-module assembly procedure.

Next, an example of the working method of the resulting aluminum-silicon carbide composite will be explained. In the aluminum-silicon carbide composite of the present invention, the peripheral portion, hole portions and the like can be easily machined by using an apparatus such as an NC lathe, a machining center or the like.

A shape-worked aluminum-silicon carbide composite is subjected to a heat treatment at a temperature of 450 to 550°

C. for at least 30 seconds while applying at least 10 KPa of stress so as to form a predetermined warped shape, thus creep-deforming and warping the aluminum-silicon carbide composite. After the warping treatment, the aluminum-silicon carbide composite is annealed at a temperature of 300° C. to 400° C. as needed, in order to remove residual stress generated during warping. The power-module base plate of the present invention has a warped shape that is close to an ideal spherical shape without waving or depressions, because the thickness of the aluminum layer on the surface is controlled to be extremely thin and uniform.

After the aluminum-silicon carbide composite is produced using the porous silicon carbide molded body, the heat dissipation surface may be surface-ground to expose the aluminum-silicon carbide composite. After the heat dissipation surface is surface-ground to expose the aluminum-silicon carbide composite, by annealing for at least 1 minute at a temperature of 500° C. to 560° C., warpage that is close to an ideal spherical shape is achieved due to the thermal expansion difference between the aluminum alloy layer on one main surface of the aluminum-silicon carbide composite and the aluminum-silicon carbide composite.

Furthermore, the plate thickness of the power-module base plate of the present invention is 2 mm to 6 mm. If the plate thickness is less than 2 mm, the heat dissipation in the planar direction of the base plate is reduced when used as a power-module base plate, thereby reducing the heat dissipation of the power module, which is undesirable. On the other hand, if the plate thickness exceeds 6 mm, the thermal resistance of the base plate itself becomes large, and the heat dissipation of the power module is reduced, which is undesirable.

The aluminum-silicon carbide composite according to the present invention, when used as a power-module base plate, is generally used by joining by soldering to a ceramic circuit board. Therefore, the surface of the aluminum-silicon carbide composite must be Ni-plated. The plating method is not particularly limited, and either electroless plating or electroplating may be used. The thickness of the Ni plating should preferably be 1 to 20 µm. If the plating thickness is less than 1 µm, then plating pinholes may be formed in parts, and soldering voids (cavities) may be formed during soldering, so that the heat dissipation properties from the circuit board may in some cases be reduced. On the other hand, if the thickness of the Ni plating exceeds 20 µm, plating separation may, in some cases, occur due to the thermal expansion difference between the Ni plating film and the surface aluminum alloy. Regarding the purity of the Ni plating film, there are no particular restrictions as long as there are no problems in the solder wettability, and phosphorus, boron or the like may be included. The Ni plating surface may further be gold-plated.

EXAMPLES

Herebelow, the present invention will be further explained based on examples and comparative examples, but the present invention is not to be construed as being limited thereto.

Example 1

100 g of silicon carbide powder A (manufactured by Pacific Rundum: NG-150, average particle diameter: 100 µm), 100 g of silicon carbide powder B (manufactured by Pacific Rundum: NG-220, average particle diameter: 60 µm), 100 g of silicon carbide powder C (manufactured by Yakushima Denko: GC-1000F, average particle diameter: 10 µm) and 30 g of a silica sol (manufactured by Nissan Chemical Industries: Snowtex) were weighed out and mixed in a stirrer/mixer for 30 minutes, then press-molded at a pressure of 10 MPa into the shape of a flat plate with dimensions of 190 mm×140 mm×5.5 mm.

The resulting molded body was dried for 2 hours at a temperature of 120° C., then baked for 2 hours at a temperature of 950° C. in air, to obtain a porous silicon carbide molded body with a relative density of 65%. The resulting porous silicon carbide molded body was surface-worked to a thickness of 4.8 mm using a surface grinding machine with a diamond grinding wheel, then the peripheral portions were worked to external shape dimensions of 183×133 mm using a machining center. The three-point bending strength of the resulting porous silicon carbide molded body was measured to be 10 MPa.

Mullite ceramic fibers (average fiber diameter 15 µm, average aspect ratio 120, volume proportion 5 vol %) were arranged adjacent to both long sides of the periphery of the resulting porous silicon carbide molded body (proportion of aluminum-ceramic fiber composite occupied in peripheral portion: 58 area %), both surfaces were clamped by carbon-coated stainless steel plates with dimensions of 210 mm×160 mm×0.8 mm, 30 were stacked, after which iron plates with a thickness of 6 mm were disposed on both sides, connected with six M10 bolts, which were tightened with a torque wrench so that the tightening torque in the planar direction was 3 Nm, forming a single block. Next, the integrated block was preheated to 600° C. in an electric furnace, then placed in a preheated press mold with an inner diameter of 400 mmφ, and a molten aluminum alloy comprising 12 mass % of silicon and 0.8 mass % of magnesium was poured in and the silicon carbide porous body was impregnated with the aluminum alloy by pressurizing for 20 minutes at a pressure of 100 MPa. After cooling to 25° C., the block was cut along the shapes of the mold release plates using a wet bandsaw, the clamped stainless steel plates were stripped away, and thereafter, an annealing treatment was performed for 3 hours at a temperature of 530° C. in order to remove strain generated at the time of impregnation, to obtain an aluminum-silicon carbide composite.

Through holes with a diameter of 7 mm were formed at eight locations and φ 10 to 4 mm countersinks were formed at four locations on the edge portions of the resulting aluminum-silicon carbide composite, and the aluminum portions and the aluminum-ceramic fiber composite portions of the periphery were worked with an NC lathe to a shape of 187 mm×137 m×5.0 mm. Next, in order to warp this aluminum-silicon carbide composite, a carbon concavo-convex mold provided with a spherical surface having a radius of curvature of 15000 mm was prepared. This concavo-convex mold was mounted on a hot press and heated to set the surface temperature of the mold to 470° C. The aforementioned composite was arranged between this concavo-convex mold and pressed at 400 KPa. At this time, a thermocouple was placed in contact with the side surface of the composite to measure the temperature. After holding for 3 minutes from the time the temperature of the composite reached 450° C., the pressure was released and the composite was naturally cooled to 50° C. Next, in order to remove strain, an annealing treatment was performed for 1 hour at a temperature of 350° C. in an electric furnace. The amount of warpage for every 10 cm of length in the resulting composite was measured using a contour shape measuring device (manufactured by Tokyo Seimitsu; Contourecord 1600D-22), and a warpage of 80 μm had been applied for every 10 cm of length.

After cleaning the resulting alumina-silicon carbide composite by performing a blast treatment using alumina abrasive grains at a pressure of 0.4 MPa and a transport speed of 1.0 m/min, electroless Ni—P and Ni—B plating was performed. A plating layer with a thickness of 8 μm (Ni—P: 6 μm+Ni—B: 2 μm) was formed on the composite surface.

The resulting aluminum-silicon carbide composite was ground to produce a sample for measuring the thermal expansion coefficient (plate-shaped body of length 20 mm, width 4 mm and thickness 4 mm), a sample for measuring the thermal conductivity (plate-shaped body of length 10 mm, width 10 mm and thickness 1 mm) and a sample for measuring the strength (plate-shaped body of length 40 mm, width 4 mm and thickness 3 mm). Using the respective samples, for the first phase, the thermal expansion coefficient from 25° C. to 150° C. was measured using a thermal expansion meter (manufactured by Seiko Instruments; TMA300), the thermal conductivity at 25° C. was measured by the laser flash method (manufactured by Rigaku; TC-7000) and the three-point bending strength at 25° C. was measured using a flexural strength meter (manufactured by Imada Seisakusho; SV-301). The obtained results are shown in Table 1.

Next, the peripheral aluminum-ceramic fiber composite portion (second phase) of the resulting aluminum-silicon carbide composite was ground to produce a sample for measuring the thermal expansion coefficient (plate-shaped body of length 20 mm, width 4 mm and thickness 4 mm) and a sample for measuring the strength (plate-shaped body of length 40 mm, width 4 mm and thickness 3 mm). Using the respective samples, for the second phase, the thermal expansion coefficient from 25° C. to 150° C. was measured using a thermal expansion meter (manufactured by Seiko Instruments; TMA300), and the three-point bending strength at 25° C. and 150° C. was measured using a flexural strength meter (manufactured by Imada Seisakusho; SV-301). The obtained results are shown in Table 1.

Using the plated product of Example 1, a heat cycle test was performed in 10 cycles wherein the plated product was placed on a hot plate heated to a temperature of 350° C., and after reaching a material temperature of 350° C. and holding for 10 minutes, the product was allowed to naturally cool to 25° C. After the heat cycle test of Example 1, no waving or depressions were observed in the aluminum-silicon carbide composite. Additionally, upon observing the peripheral portions by eye, there were no cracks, and upon performing internal flaw inspection using an ultrasonic flaw detector, there were no cracks in the aluminum-silicon carbide composite.

Next, after joining an Al circuit board to the plated product of Example 1 using a lead-free solder, and after performing a heat cycle test (500 cycles) of holding for 30 minutes in thermostatic tanks of −40° C. and 125° C., upon checking the external appearance and the joining state using an ultrasonic flaw detector, no cracks were observed in the solder which is the joining layer. The obtained results are shown in Table 2.

Example 2

100 g of silicon carbide powder A (manufactured by Pacific Rundum: NG-150, average particle diameter: 100 μm), 100 g of silicon carbide powder B (manufactured by Pacific Rundum: NG-220, average particle diameter: 60 μm), 100 g of silicon carbide powder C (manufactured by Yakushima Denko: GC-1000F, average particle diameter: 10 μm) and 30 g of a silica sol (manufactured by Nissan Chemical Industries: Snowtex) were weighed out and mixed in a stirrer/mixer for 30 minutes, then press-molded at a pressure of 10 MPa into the shape of a flat plate with dimensions of 190 mm×140 mm×5.5 mm.

The resulting molded body was dried for 2 hours at a temperature of 120° C., then baked for 2 hours at a temperature of 950° C. in air, to obtain a porous silicon carbide molded body with a relative density of 65%. The resulting porous silicon carbide molded body was surface-worked to a thickness of 4.8 mm using a surface grinding machine with a diamond grinding wheel, then the peripheral portions were worked to external shape dimensions of 183×133 mm using a machining center. The three-point bending strength of the resulting porous silicon carbide molded body was measured to be 10 MPa.

Mullite ceramic fibers (average fiber diameter 15 μm, average aspect ratio 120, volume proportion 5 vol %) were arranged adjacent to both long sides and both short sides of the periphery of the porous silicon carbide molded body (proportion of aluminum-ceramic fiber composite occupied in peripheral portion: 100 area %), and an aluminum-silicon carbide composite was obtained in the same manner as Example 1.

Using the plated product of Example 2, a heat cycle test was performed in 10 cycles wherein the plated product was placed on a hot plate heated to a temperature of 350° C., and after reaching a material temperature of 350° C. and holding for 10 minutes, the product was allowed to naturally cool to 25° C.

Next, after joining an Al circuit board to the plated product of Example 2 using a lead-free solder, a heat cycle test (500 cycles) of holding for 30 minutes in thermostatic tanks of −40° C. and 125° C. was performed. The obtained results are shown in Table 2.

Example 3

An aluminum-silicon carbide composite was obtained in the same manner as Example 1, except that the volume proportion of the ceramic fiber was set to 20 vol %.

Using the plated product of Example 3, a heat cycle test was performed in 10 cycles wherein the plated product was placed on a hot plate heated to a temperature of 350° C., and after reaching a material temperature of 350° C. and holding for 10 minutes, the product was allowed to naturally cool to 25° C.

Next, after joining an Al circuit board to the plated product of Example 3 using a lead-free solder, a heat cycle test (500 cycles) of holding for 30 minutes in thermostatic tanks of −40° C. and 125° C. was performed. The obtained results are shown in Table 2.

Example 4

The aluminum-silicon carbide composite of Example 1 was ground by 1.0 mm using a planar grinding machine with a diamond grinding wheel to expose the aluminum-silicon carbide composite, to a shape of 187×137×4 mm. Next, the resulting workpiece was annealed for 1 hour at a temperature of 530° C. in an electric furnace in order to remove strain generated at the time of working. Next, after cleaning by performing a blast treatment using alumina abrasive grains at a pressure of 0.4 MPa and a transport speed of 1.0 m/min, electroless Ni—P and Ni—B plating was performed.

A plating layer with a thickness of 8 μm (Ni—P: 6 μm+Ni—B: 2 μm) was formed on the composite surface.

Using the plated product of Example 4, a heat cycle test was performed in 10 cycles wherein the plated product was placed on a hot plate heated to a temperature of 350° C., and after reaching a material temperature of 350° C. and holding for 10 minutes, the product was allowed to naturally cool to 25° C.

Next, after joining an Al circuit board to the plated product of Example 4 using a lead-free solder, a heat cycle test (500 cycles) of holding for 30 minutes in thermostatic tanks of −40° C. and 125° C. was performed. The obtained results are shown in Table 2.

Examples 5 and 6

Aluminum-silicon carbide composites were obtained in the same manner as Example 1 except that the silicon carbide contents in the aluminum-silicon carbide composites were set to 50 vol % and 80 vol %.

Using the plated products of Examples 5 and 6, heat cycle tests were performed in 10 cycles wherein the plated products were placed on a hot plate heated to a temperature of 350° C., and after reaching a material temperature of 350° C. and holding for 10 minutes, the products were allowed to naturally cool to 25° C.

Next, after joining Al circuit boards to the plated products of Examples 5 and 6 using a lead-free solder, heat cycle tests (500 cycles) of holding for 30 minutes in thermostatic tanks of −40° C. and 125° C. were performed. The obtained results are shown in Table 2.

Examples 7 and 8

Aluminum-silicon carbide composites were obtained in the same manner as Example 1, except that the porous silicon carbide composite molded bodies were surface-worked to thicknesses of 1.8 mm and 5.8 mm using a planar grinding machine with a diamond grinding wheel, to adjust the thicknesses of the aluminum-silicon carbide composites to 2.0 mm and 6.0 mm.

Using the plated products of Examples 7 and 8, heat cycle tests were performed in 10 cycles wherein the plated products were placed on a hot plate heated to a temperature of 350° C., and after reaching a material temperature of 350° C. and holding for 10 minutes, the products were allowed to naturally cool to 25° C.

Next, after joining Al circuit boards to the plated products of Examples 7 and 8 using a lead-free solder, heat cycle tests (500 cycles) of holding for 30 minutes in thermostatic tanks of −40° C. and 125° C. were performed. The obtained results are shown in Table 2.

Example 9

An aluminum-silicon carbide composite was obtained in the same manner as Example 1, except that the average fiber diameter of the ceramic fibers was 20 μm, the average aspect ratio was 100 and the volume proportion was 5 vol %.

Using the plated product of Example 9, a heat cycle test was performed in 10 cycles wherein the plated product was placed on a hot plate heated to a temperature of 350° C., and after reaching a material temperature of 350° C. and holding for 10 minutes, the product was allowed to naturally cool to 25° C.

Next, after joining an Al circuit board to the plated product of Example 9 using a lead-free solder, a heat cycle test (500 cycles) of holding for 30 minutes in thermostatic tanks of −40° C. and 125° C. was performed. The obtained results are shown in Table 2.

Comparative Example 1

100 g of silicon carbide powder A (manufactured by Pacific Rundum: NG-150, average particle diameter: 100 μm), 100 g of silicon carbide powder B (manufactured by Pacific Rundum: NG-220, average particle diameter: 60 μm), 100 g of silicon carbide powder C (manufactured by Yakushima Denko: GC-1000F, average particle diameter: 10 μm) and 30 g of a silica sol (manufactured by Nissan Chemical Industries: Snowtex) were weighed out and mixed in a stirrer/mixer for 30 minutes, then press-molded at a pressure of 10 MPa into the shape of a flat plate with dimensions of 190 mm×140 mm×5.5 mm.

The resulting molded body was dried for 2 hours at a temperature of 120° C., then baked for 2 hours at a temperature of 950° C. in air, to obtain a porous silicon carbide molded body with a relative density of 65%. The resulting porous silicon carbide molded body was surface-worked to a thickness of 4.8 mm using a surface grinding machine with a diamond grinding wheel, then the peripheral portions were worked to external shape dimensions of 183×133 mm using a machining center. The three-point bending strength of the resulting porous silicon carbide molded body was measured to be 10 MPa.

Mullite ceramic fibers (average fiber diameter 15 μm, average aspect ratio 120, volume proportion 5 vol %) were arranged adjacent to one long side of the periphery of the resulting porous silicon carbide molded body (proportion of aluminum-ceramic fiber composite occupied in peripheral portion: 29 area %), and an aluminum-silicon carbide composite was obtained in the same manner as Example 1.

After cleaning the resulting aluminum-silicon carbide composite by performing a blast treatment using alumina abrasive grains at a pressure of 0.4 MPa and a transport speed of 1.0 m/min, electroless Ni—P and Ni—B plating was performed. A plating layer with a thickness of 8 μm (Ni—P: 6 μm+Ni—B: 2 μm) was formed on the composite surface.

Using the plated product of Comparative Example 1, a heat cycle test was performed in 10 cycles wherein the plated product was placed on a hot plate heated to a temperature of 350° C., and after reaching a material temperature of 350° C. and holding for 10 minutes, the product was allowed to naturally cool to 25° C., whereupon waving was observed after the test.

Next, after joining an Al circuit board to the plated product of Comparative Example 1 using a lead-free solder, and after performing a heat cycle test (500 cycles) of holding for 30 minutes in thermostatic tanks of −40° C. and 125° C., upon checking the external appearance and the joining state using an ultrasonic flaw detector, no cracks were observed in the solder which is the joining layer. The obtained results are shown in Table 2.

Comparative Example 2

An aluminum-silicon carbide composite was obtained in the same manner as Example 1, except that the silicon carbide content in the aluminum-silicon carbide composite was set to 45 vol %.

Using the plated product of Comparative Example 2, a heat cycle test was performed in 10 cycles wherein the plated product was placed on a hot plate heated to a temperature of 350° C., and after reaching a material temperature of 350° C. and holding for 10 minutes, the product was allowed to naturally cool to 25° C.

Next, after joining an Al circuit board to the plated product of Comparative Example 2 using a lead-free solder, and after performing a heat cycle test (500 cycles) of holding for 30 minutes in thermostatic tanks of −40° C. and 125° C., upon checking the external appearance and the joining state using an ultrasonic flaw detector, cracks were observed in the solder which is the joining layer.

Comparative Example 3

An aluminum-silicon carbide composite was obtained in the same manner as Example 1, except that the silicon carbide content in the aluminum-silicon carbide composite was set to 85 vol %. Upon performing internal flaw inspection of the resulting aluminum-silicon carbide composite using an ultrasonic flaw detector, cracks were observed in the aluminum-silicon carbide composite.

Comparative Example 4

An aluminum-silicon carbide composite was obtained in the same manner as Example 1, except that the porous silicon carbide molded body was surface-worked to a thickness of 1.3 mm using a planar grinding machine with a diamond grinding wheel, and the thickness of the aluminum-silicon carbide composite was set to 1.5 mm. Upon performing internal flaw inspection of the resulting aluminum-silicon carbide composite using an ultrasonic flaw detector, cracks were observed in the aluminum-silicon carbide composite.

Comparative Example 5

An aluminum-silicon carbide composite was obtained in the same manner as Example 1, except that the porous silicon carbide molded body was surface-worked to a thickness of 6.3 mm using a planar grinding machine with a diamond grinding wheel, and the thickness of the aluminum-silicon carbide composite was set to 6.5 mm.

Using the plated product of Comparative Example 5, a heat cycle test was performed in 10 cycles wherein the plated product was placed on a hot plate heated to a temperature of 350° C., and after reaching a material temperature of 350° C. and holding for 10 minutes, the product was allowed to naturally cool to 25° C.

Next, after joining an Al circuit board to the plated product of Comparative Example 5 using a lead-free solder, and after performing a heat cycle test (500 cycles) of holding for 30 minutes in thermostatic tanks of −40° C. and 125° C., upon checking the external appearance and the joining state using an ultrasonic flaw detector, cracks were observed in the solder which is the joining layer.

Comparative Example 6

An aluminum-silicon carbide composite was obtained in the same manner as Example 1, except that the average fiber diameter of the ceramic fiber was 25 μm, the average aspect ratio was 90 and the volume proportion was 5 vol %. Upon observing the periphery of the resulting aluminum-silicon carbide composite by eye, cracks were observed in the peripheral aluminum-ceramic fiber composite portion.

Comparative Example 7

An aluminum-silicon carbide composite was obtained in the same manner as Example 1, except that the average fiber diameter of the ceramic fiber was 15 μm, the average aspect ratio was 120 and the volume proportion was 25 vol %.

After cleaning the resulting aluminum-silicon carbide composite by performing a blast treatment using alumina abrasive grains at a pressure of 0.4 MPa and a transport speed of 1.0 m/min, electroless Ni—P and Ni—B plating was performed. A plating layer with a thickness of 8 μm (Ni—P: 6 μm+Ni—B: 2 μm) was formed on the composite surface.

Upon observing the periphery of the plated product of Comparative Example 7 by eye, many unplated portions were observed in the peripheral aluminum-ceramic fiber composite portion.

The principal conditions and results of the Examples and Comparative Examples are shown in Tables 1 and 2. For Examples 2 to 9 and Comparative Examples 1 to 7, the thermal expansion coefficient, thermal conductivity and three-point bending strength of the first phase were measured in the same manner as Example 1.

TABLE 1

| | Aluminum-Silicon Carbide Composite | | | | | Aluminum-Ceramic Fiber Composite | | | | | |
| | | | | | | Ceramic Fiber | | | | | |
| | Silicon Carbide Content (vol %) | Plate Thickness (mm) | Thermal Expansion Coefficient (×10⁻⁶/K) | Thermal Conductivity (W/mK) | Strength: 25° C. (MPa) | Average Fiber Diameter (μm) | Aspect Ratio | Content (vol %) | Thermal Expansion Coefficient (×10⁻⁶/K) | Strength: 25° C. (MPa) | Strength: 150° C. (MPa) |
|---|---|---|---|---|---|---|---|---|---|---|---|
| Example 1 | 65 | 5.0 | 7.2 | 208 | 412 | 15 | 120 | 5.0 | 19.0 | 270 | 221 |
| Example 2 | 65 | 5.0 | 7.1 | 211 | 421 | 15 | 120 | 5.0 | 19.2 | 266 | 215 |
| Example 3 | 65 | 5.0 | 7.2 | 201 | 395 | 15 | 120 | 20.0 | 17.5 | 345 | 302 |
| Example 4 | 65 | 5.0 | 6.9 | 205 | 399 | 15 | 120 | 5.0 | 19.1 | 281 | 232 |
| Example 5 | 50 | 5.0 | 8.8 | 173 | 365 | 15 | 120 | 5.0 | 18.8 | 260 | 211 |
| Example 6 | 80 | 5.0 | 6.2 | 280 | 326 | 15 | 120 | 5.0 | 18.8 | 267 | 214 |
| Example 7 | 65 | 2.0 | 7.3 | 207 | 409 | 15 | 120 | 5.0 | 19.0 | 273 | 226 |
| Example 8 | 65 | 6.0 | 7.3 | 218 | 401 | 15 | 120 | 5.0 | 18.5 | 277 | 205 |
| Example 9 | 65 | 5.0 | 7.2 | 222 | 395 | 20 | 100 | 5.0 | 18.7 | 279 | 210 |
| Comparative Example 1 | 65 | 5.0 | 7.1 | 205 | 411 | 15 | 120 | 5.0 | 18.7 | 275 | 230 |
| Comparative Example 2 | 45 | 5.0 | 9.7 | 155 | 420 | 15 | 120 | 5.0 | 18.8 | 283 | 218 |
| Comparative Example 3 | 85 | 5.0 | 5.5 | 298 | 312 | 15 | 120 | 5.0 | 19.0 | 268 | 212 |
| Comparative Example 4 | 65 | 1.5 | 7.4 | 209 | 398 | 15 | 120 | 5.0 | 18.6 | 277 | 208 |
| Comparative Example 5 | 65 | 6.5 | 7.4 | 213 | 425 | 15 | 120 | 5.0 | 18.5 | 264 | 205 |
| Comparative Example 6 | 65 | 5.0 | 7.1 | 210 | 421 | 25 | 90 | 5.0 | 18.8 | 256 | 201 |

TABLE 1-continued

| | Aluminum-Silicon Carbide Composite | | | | | Aluminum-Ceramic Fiber Composite | | | | | |
| | | | | | | Ceramic Fiber | | | | | |
| | Silicon Carbide Content (vol %) | Plate Thickness (mm) | Thermal Expansion Coefficient (×10⁻⁶/K) | Thermal Conductivity (W/mK) | Strength: 25° C. (MPa) | Average Fiber Diameter (μm) | Aspect Ratio | Content (vol %) | Thermal Expansion Coefficient (×10⁻⁶/K) | Strength: 25° C. (MPa) | Strength: 150° C. (MPa) |
|---|---|---|---|---|---|---|---|---|---|---|---|
| Comparative Example 7 | 65 | 5.0 | 7.2 | 218 | 396 | 15 | 120 | 25.0 | 16.3 | 336 | 297 |

TABLE 2

| | Flaws in Aluminum-Silicon Carbide Composite | Flaws in Heat Cycle (25° C. to 350° C.) | Flaws in Heat Cycle (−45° C. to 120° C.) After Mounting on Circuit Board |
|---|---|---|---|
| Example 1 | none | none | none |
| Example 2 | none | none | none |
| Example 3 | none | none | none |
| Example 4 | none | none | none |
| Example 5 | none | none | none |
| Example 6 | none | none | none |
| Example 7 | none | none | none |
| Example 8 | none | none | none |
| Example 9 | none | none | none |
| Comparative Example 1 | none | aluminum-silicon carbide composite (first phase) was wavy | — |
| Comparative Example 2 | none | none | solder cracks |
| Comparative Example 3 | aluminum-silicon carbide composite (first phase) had cracks | — | — |
| Comparative Example 4 | aluminum-silicon carbide composite (first phase) had cracks | — | — |
| Comparative Example 5 | none | none | solder cracks |
| Comparative Example 6 | aluminum-ceramic fiber portion (second phase) had cracks | — | — |
| Comparative Example 7 | aluminum-ceramic fiber portion (second phase) was unplated | — | — |

Figure 1:
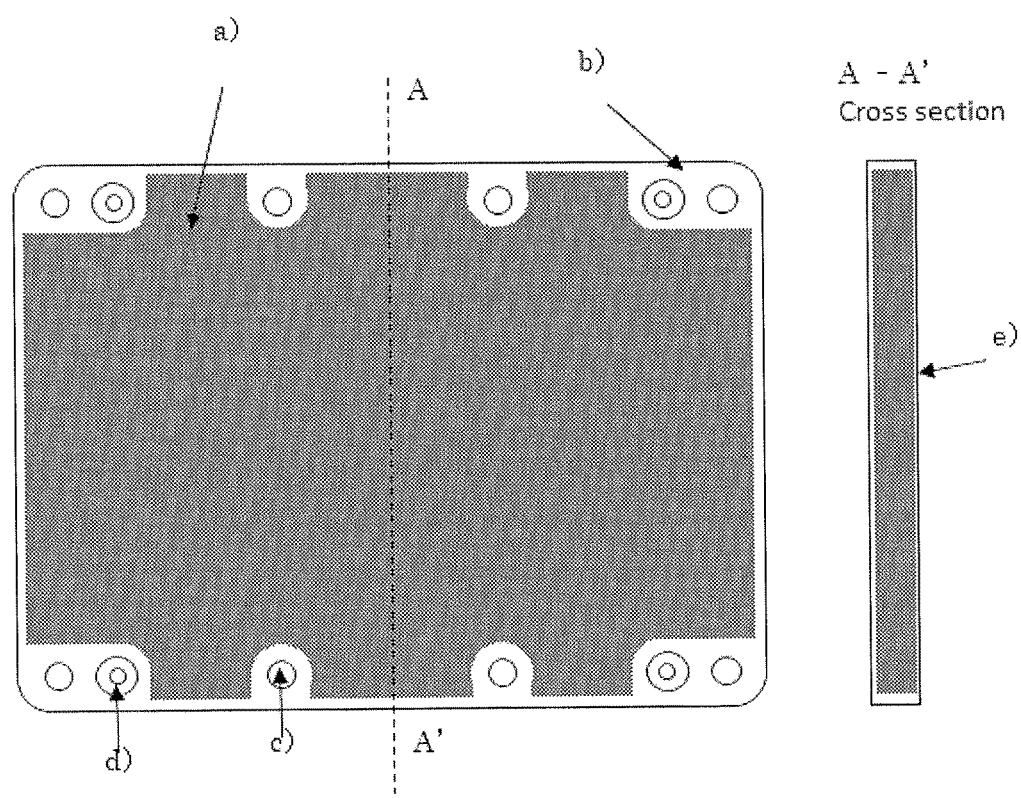
FIG. 1 An explanatory diagram showing an embodiment of the aluminum-silicon carbide composite used in the present invention.
Figure 2:
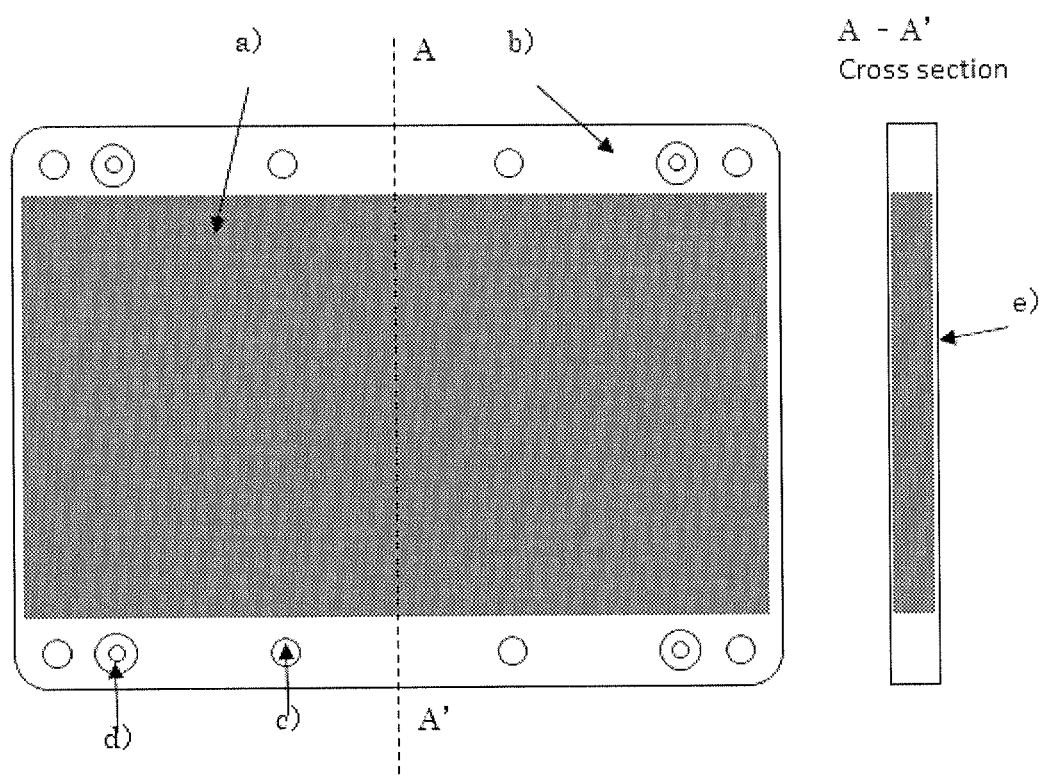
FIG. 2 An explanatory diagram showing an embodiment of the aluminum-silicon carbide composite used in the present invention.

DESCRIPTION OF REFERENCE SYMBOLS a) Aluminum-silicon carbide composite
b) Peripheral portion including aluminum-ceramic fiber composite
c) ϕ 7 mm through hole
d) ϕ 10 to 4 mm countersink
e) Surface aluminum alloy layer

The invention claimed is:

1. An aluminum-silicon carbide composite comprising
a first phase comprising a flat plate-shaped aluminum-silicon carbide composite having a plate thickness of 2 to 6 mm formed by impregnating, with a metal containing aluminum, a porous silicon carbide molded body having a silicon carbide content of 50 to 80 vol %; and
on a periphery of the first phase, a second phase comprising an aluminum-ceramic fiber composite containing, at a proportion of 3 to 20% by volume, ceramic fibers comprising alumina or silica and having an average fiber diameter of at most 20 μm and an average aspect ratio of at least 100;
wherein a proportion of the aluminum-ceramic fiber composite contained in the second phase is at least 50 area % of the peripheral area of the first phase.

2. The aluminum-silicon carbide composite according to claim 1, wherein a thermal expansion coefficient of the aluminum-ceramic fiber composite is less than 20×10⁻⁶/K, a strength at 25° C. is at least 200 MPa and a strength at 150° C. is at least 150 MPa.

3. The aluminum-silicon carbide composite according to claim 1, wherein both main surfaces of the first phase are covered by an aluminum alloy layer or an aluminum-ceramic fiber layer.

4. The aluminum-silicon carbide composite according to claim 1, wherein one main surface of the first phase is covered by an aluminum alloy layer or an aluminum-ceramic fiber layer.

5. The aluminum-silicon carbide composite according to claim 1, wherein a ceramic fiber content in the aluminum-ceramic fiber composite contained in the second phase is 5 to 20 vol % with respect to an entire aluminum-ceramic fiber composite.

6. The aluminum-silicon carbide composite according to claim 1, wherein the ceramic fiber comprises one or more materials chosen from among alumina, silica, boron nitride, and silicon nitride.

7. A power-module base plate formed by plating a surface of the aluminum-silicon carbide composite according to claim 1.

8. The aluminum-silicon carbide composite according to claim 1, wherein the aluminum alloy layer has an average thickness of 0.05 mm to 0.3 mm.

* * * * *